United States Patent [19]

Berger

[11] Patent Number: 5,382,498
[45] Date of Patent: Jan. 17, 1995

[54] PROCESSES FOR ELECTRON LITHOGRAPHY

[75] Inventor: Steven D. Berger, Basking Ridge, N.J.

[73] Assignee: AT&T Corp., Murray Hill, N.J.

[21] Appl. No.: 991,685

[22] Filed: Dec. 16, 1992

[51] Int. Cl.6 .................................................. G03F 9/00
[52] U.S. Cl. ........................................ 430/296; 430/5; 430/269; 430/311; 430/942
[58] Field of Search ............... 430/269, 311, 296, 942, 430/5

[56] References Cited

U.S. PATENT DOCUMENTS

| | | | |
|---|---|---|---|
| 5,079,112 | 1/1992 | Berger et al. | 430/4 |
| 5,130,213 | 7/1992 | Berger et al. | 430/296 |
| 5,258,246 | 11/1993 | Berger et al. | 430/4 |
| 5,279,925 | 1/1994 | Berger et al. | 430/296 |
| 5,316,879 | 5/1994 | Berger et al. | 430/296 |

OTHER PUBLICATIONS

*Journal of Vacuum Science and Technology*, 15, 849–852, May/Jun. (1978)—H. Ohiwa.

*Microcircuit Engineering* 83, "Variable Axis Immersion Lens (VAIL)", 107–116, Academic Press London (1983)—M. A. Sturans and H. C. Pfeiffer.

*Microelectronic Engineering* 17, "Progress in Ion Projection Lithography", 229–240, Elsevier Science Publishers (1992)—A. Chalupka, et al.

*Primary Examiner*—Charles L. Bowers, Jr.
*Assistant Examiner*—Mark F. Huff
*Attorney, Agent, or Firm*—Bruce S. Schneider

[57] ABSTRACT

Projection lithographic systems relying on radiant energy such as electrons and ion beams are substantially affected by the distance between the projection mask and the substrate. In particular, to avoid undesirable limitation of the obtainable resolution, this distance should be a meter or less.

5 Claims, 3 Drawing Sheets

PROCESSES FOR ELECTRON LITHOGRAPHY

BACKGROUND OF THE INVENTION

1. Field of the Invention

This invention relates to projection lithography processes and in particular electron projection lithographic processes.

2. Art Background

In device processing, an energy sensitive material, denominated a resist, is coated on a substrate such as a semiconductor wafer (e.g., a silicon wafer), a ferroelectric wafer, an insulating wafer, (e.g. a sapphire wafer), a chromium layer supported by a substrate, or a substrate comprising some combination of such materials. The resist is exposed by subjecting it to radiation in the desired image. This image is then developed to produce a patterned resist generally by immersing the resist in a suitable solvent or subjecting it to a plasma to remove selectively either the exposed or unexposed regions. The developed pattern is employed as a mask to process, e.g., etch, the underlying layer. The resist is then removed (for many devices), subsequent layers are formed, and the resist process is repeated to form overlying patterns in the device. In such repetition of the resist process, the pattern in the resist being processed is typically aligned (registered) relative to underlying patterns by using fiducial marks.

Various approaches have been proposed for the exposure of a resist with charged particle beams, e.g., electron beams, in the manufacture of submicron devices. (Submicron devices in the context of this invention is a body having a pattern with either lines or spaces smaller than 1 μm). Electron beam exposure has been extensively used for the making of lithographic masks where the resist overlies a chromium layer that in turn overlies a quartz substrate. The image is produced by raster scanning an electron beam over the resist material in a single cycle and shuttering the beam at appropriate positions to produce the desired exposure image. This single cycle, raster process is capable of producing extremely fine features, but is generally too slow for making devices other than masks.

Alternative approaches have been proposed for exposing devices other than masks in suitable times. (Generally lithographic processing at least 30–60 wafers per hour is considered desirable where a wafer is a substrate typically from two to ten inches in diameter that is ultimately subdivided after fabrication into a plurality of devices). These exposure approaches are generally divided into proximity and projection procedures. In the former, a mask defining the image by absorptive/reflective regions and transmissive regions for the exposing energy is placed in close proximity to the resist. An electron beam is scanned over the mask or light is flooded onto the mask to expose the underlying resist in regions corresponding to transmissive areas of the mask.

In a projection approach, a lens is interposed between the mask and the resist. The mask is either the absorptive/transmissive type previously described or, alternatively, of a type that scatters in one set of regions to a greater extent than in a second to produce the desired image. The fluence traversing the mask is focused by the lens onto the resist to produce an image corresponding to the mask pattern.

In one specific approach to projection lithography, schematically illustrated in FIG. 3, (described in U.S. Pat. No. 5,079,112 dated Jan. 7, 1992, which is hereby incorporated by reference) a mask 20 is employed which scatters and/or reflects incident electrons 10 in a first set of regions 30 and scatters to a lesser extent, e.g., transmits, in a second set of regions 40. The electrons 10a traversing mask 20 are caused to converge at one or more convergence points by an electron optic projection lens 50. An area more transmissive, e.g., aperture 70, than the surrounding area 80 is positioned at such convergence point. Scattered electrons, 10b and 10c, do not converge at this point and are blocked while unscattered electrons 10a do converge at aperture 70 and emerge to expose resist on substrate 90.

Typically, in an electron exposure proximity printing procedure the electron beam is scanned electronically, i.e., by use of magnetic and electric fields over the mask. In one study published in *Proc. 8th Symp. on Electron and Ion Beam Science and Technology*, 406–419 (1978), it is suggested that a very rapid line scan, i.e., faster than 0.2 ms, with repeated exposure of each portion of the resist to effect the desired dosage is useful to avoid localized heating, and thus localized expansion of the mask. In contrast, expansion of the entire substrate due to uniform heating is electronically compensated for during exposure. (See W. M. Moreau, *Semiconductor Lithography*, Plenum Press, New York, page 435 (1988)). Localized deformations produce errors (called overlay errors) in the placement, i.e., registration, of a resist pattern relative to an underlying pattern. Instead of scanning at a sufficiently slow rate to expose fully each region during one scan cycle, the rate of scanning is substantially increased and exposure is accomplished through a plurality of rapid scan cycles. Despite such precautions, higher acceleration potentials, although yielding enhanced resolution, nevertheless lead to rapidly increasing overlay errors.

For projection light lithography other schemes such as a step and scan procedure have been proposed. In this procedure, a portion of the mask is illuminated over a strip. The image of the entire mask is then projected on the resist by moving the mask and the wafer in opposite directions at a relative rate of speed that depends on the demagnification of the system. For example, if the system has a 4:1 demagnification (meaning a unit length of the mask is projected onto a corresponding one quarter unit length on the substrate) the mask is moved at a rate four times faster than the substrate.

The distance between mask and substrate in an electron projection lithographic system has, with progressing development, become significantly greater. This trend toward longer columns, i.e., longer distances between mask and substrate, has been driven by various optical considerations. Typically, a larger image field is available with lenses having longer focal lengths. Additionally, such longer focal lengths tend to reduce error associated with curvature of field. However, a longer focal length, depending on the extent of demagnification used, requires a longer column. (Demagnification is the degree of reduction of mask dimension of a feature to corresponding substrate size of the same feature). As shown in FIGS. 1 and 2, as the demagnification becomes greater for a conventional projection lens, the distance between the substrate and the mask increases. Thus, in such systems as shown in FIG. 1, for 1:1 demagnification the distance, 5, between the mask, 1, and projection lens, 3, (represented by a diagrammatic single lens) is approximately the same size as the distance, 7, between the projection lens and the substrate, 9. Similarly, in a corresponding 4:1 projection system, the proportion of these two distances is correspondingly 4 to 1. As a result, the desire for longer focal lengths and increasing demagnification yields increasing column size.

SUMMARY OF THE INVENTION

It has been found, unexpectedly, that in lithographic projection imaging of patterns with design rules of 0.5 micrometer or finer, using a beam current density greater than 10 mA/cm² at the substrate a column length greater than 0.75 meter, significantly degrades obtainable resolution and should be avoided for practical currents. (The design rule corresponds to the smallest pattern feature critical to device operation). Surprisingly, column lengths greater than 0.75 meter are not only disadvantageous, but must be avoided since under such conditions the electron flux transmitted through (or reflected from) the mask toward the substrate undergoes substantial divergence and a concomitant loss in resolution. By maintaining a relatively short column length, such loss in resolution is avoided. As previously discussed, the choice of projection lens generally strongly affects the column length. By appropriate use of a projection system employing a variable axis lens or lenses, or variable axis immersion lens or lenses, or a combination, such criterion is satisfied with the resulting benefit to resolution. A variable axis lens (VAL) (sometimes known as a moving objective lens) or variable axis immersion lens (VAIL) is one in which the optic axis is scanned simultaneously with the electron beam by the superposition of a secondary magnetic field with the main field of the lens. This approach is described in detail in H. Ohiwa, *Journal of Vacuum Science and Technology*, 15, 849–852, May/June (1978). Variable axis immersion lenses are described in M. A. Sturans and H. C. Pfefffer, *Microcircuit Engineering 83*, "Variable Axis Immersion Lens (VAIL)", 107–116, Academic Press London (1983).

It has been found that previously unappreciated thermal effects strongly influence the process conditions employed to project an image onto a resist using a SCALPEL system. Surprisingly, in contrast to techniques employing absorptive masks where the localized heating gradients and associated overlay error occur predominantly in the mask and increase concomitantly with increasing acceleration voltage, for SCALPEL there is a minimum in the thermal contribution to the overlay error as the electron acceleration voltage increases. Thus, contrary to previous generic teachings, there exists in a SCALPEL exposure system a preferred range of acceleration voltages that yields a relatively low thermal error and acceptable resolution. Generally, this range of acceleration voltages limits the thermal contribution to the overlay error (hereafter called thermal error) to less than 20%, preferably 10%, most preferably 5% of the design rule. To obtain such limited thermal error, $\Delta x_{tot}$, the magnification, dwell time, and mask membrane thickness used should be that which yields an acceleration voltage, and thermal error, within the acceptable range as determined from the equation:

$$[\Delta x_{tot}]^2 = [\Delta x_{wafer}]^2 + [\Delta x_{mask}]^2 \tag{1}$$

such that $$\Delta x_{wafer} = \delta_1 \cdot \delta_2 \cdot \frac{s}{M} \cdot \alpha \cdot \Delta T_{inst} \tag{2}$$

where M is the demagnification factor, $\alpha$ is the coefficient of expansion of the wafer, e.g., silicon, $\delta_1$ (a factor determined by the elastic constraint for the geometry, i.e., a thin heated region on a thick substrate), and where the value, 0.33, applicable to a thin heated region of circular cross-section (see for example C. J. Tranter, *Quart. Appl. Math.*, 4, 298 (1947)), is sufficient in the context of this invention. Additionally, $\delta_2$ is a geometrical factor equal to 0.5; s is a subfield dimension measured at the mask which for a square, a rectangular (of aspect ratio less than 2), circular or hexagonal field (the region illuminated during the dwell time) is the longest dimension, which for a triangular field, is the longest vertex, and which for a rectangular field of aspect ratio greater than 2 is $\sqrt{5} \times$ length of the short side; $\Delta T_{inst}$ is to an acceptable approximation given by $$\Delta T_{inst} = \frac{P \cdot \Delta t}{C \cdot V} \tag{3}$$

where $\Delta t$ is the beam dwell time per flash exposure, C is the heat capacity of the wafer (for example silicon) per unit volume, and V is the volume given by:

$$V = \frac{d_h \cdot a}{M^2} \tag{4}$$

such that a is the area of the sub-field, and $d_h$ is the heated depth which is calculated as the quadrature sum of the electron range and the heat diffusion distance. The electron range can be calculated using the well known formulae discussed in compendia such as L. Reimer, *Transmission Electron Microscopy*, "Multiple-Scattering Effects", 2nd Edition, Springer-Verlag, page 185 (1989), and the heat diffusion distance, $z_{th}$, is calculated using the formula:

$$z_{th} = \sqrt{\kappa \Delta t} \tag{5}$$

where $\kappa$ is the thermal diffusivity in the substrate—the value for silicon suitably approximated by $10^{-4}$ m² s⁻¹—and P is the power incident on the wafer. The calculation of power is performed for the average thermal case, i.e., the case where 50% of the mask area is covered by pattern, so that $$P = \frac{IE}{2} \tag{6}$$

where I is the beam current incident on the wafer after passing through a mask segment containing no pattern, and E is the accelerating potential last experienced by the electrons entering the wafer. The current can be measured using a Faraday cup.

The thermal error in the mask is $\Delta x_{mask}$, and is represented by $$\Delta x_{mask} = \alpha_s \cdot \delta_2 \cdot \left(\frac{s}{M}\right) \Delta T_{im} \tag{7}$$

where $a_s$ is the coefficient of expansion of the scatterer material of the mask. The instantaneous temperature rise in the mask, $\Delta T_{im}$, is given by:

$$\Delta T_{im} = \left(\frac{P}{T}\right)\cdot\left(\frac{\Delta E}{E}\right)\cdot\left(\frac{\Delta t}{C_s V_s}\right) + \Delta T_{sm} \quad (8)$$

where $C_s$ and $V_s$ are the heat capacity and volume of the scattering material of the mask being heated; $(\Delta E/E)$ is the fractional energy lost by an electron in the mask and can be calculated using the Bethe Formula (see for example L. Reimer, *Transmission Electron Microscopy*, "Multiple Scattering Effects", 2nd Edition, Springer-Verlag, page 179 (1989)); T is the fraction of the electron-beam incident on the mask membrane which is passed by the SCALPEL aperture. (T can be determined by measuring the electron-beam current incident on the wafer after passing through an unpatterned mask membrane and dividing this by the current incident on the mask. The currents can be measured using Faraday cups).

Finally, the steady state temperature rise in the mask, $\Delta T_{sm}$, is suitably approximated by:

$$\Delta T_{sm} = \left(\frac{P}{A}\right)\cdot a \cdot \left(\frac{1}{A'\cdot C_c}\right) \quad (9)$$

where A is the maximum area scanned by the electron-beam at the mask, A' is the area of the mask in contact with a heat sink (e.g., the struts), if present, and $C_c$ is the thermal conductance from the pattern region to the heat sink, (e.g., the struts).

The invention in one embodiment involves employing a magnification, dwell time, and mask membrane thickness which would, according to equations (1) to (9), allowing an acceleration voltage, and thus thermal error, in the specified range. Dwell time is a parameter that should be considered in the context of the scanning procedure. To avoid excessive error due to thermal expansion of the mask and, even more significantly, the substrate, while ensuring complete exposure of a wafer, a combination of 1) beam scanning and 2) movement of the mask relative to the substrate is advantageously employed. A small region (e.g., 1 mm² at the mask) is illuminated by the beam spot. The beam is scanned over a somewhat larger area of the mask, typically through a 1 cm square. The scan is performed so that illumination for each spot is maintained for an illumination time, i.e., dwell time, typically for many applications in the range 0.1 $\mu$s to 10 $\mu$s with a rapid transition between illuminated regions. Appropriate dwell times, as described by equations (1) to (9), yield advantageously low thermal error. The entire wafer is exposed by moving the mask relative to the substrate.

Similarly, as discussed above, the membrane thickness of the mask should be approximately chosen. Additionally, with such choice, nonuniformities in the mask or from mask to mask upon heating are susceptible to correction.

DETAILED DESCRIPTION

Figure 1:
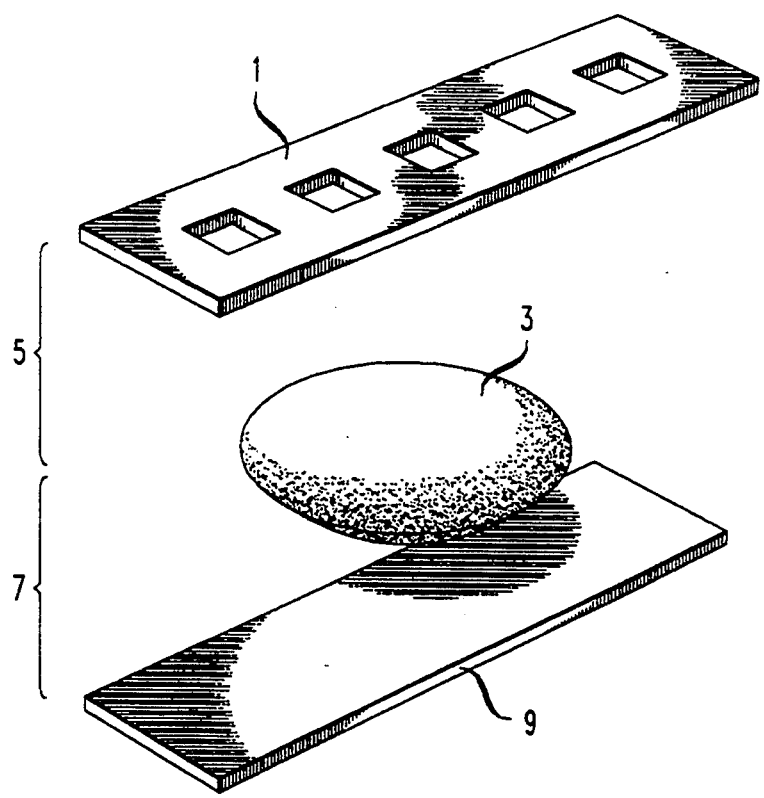
FIGS. 1 and 2 illustrate some effects of demagnification on column length.
Figure 2:
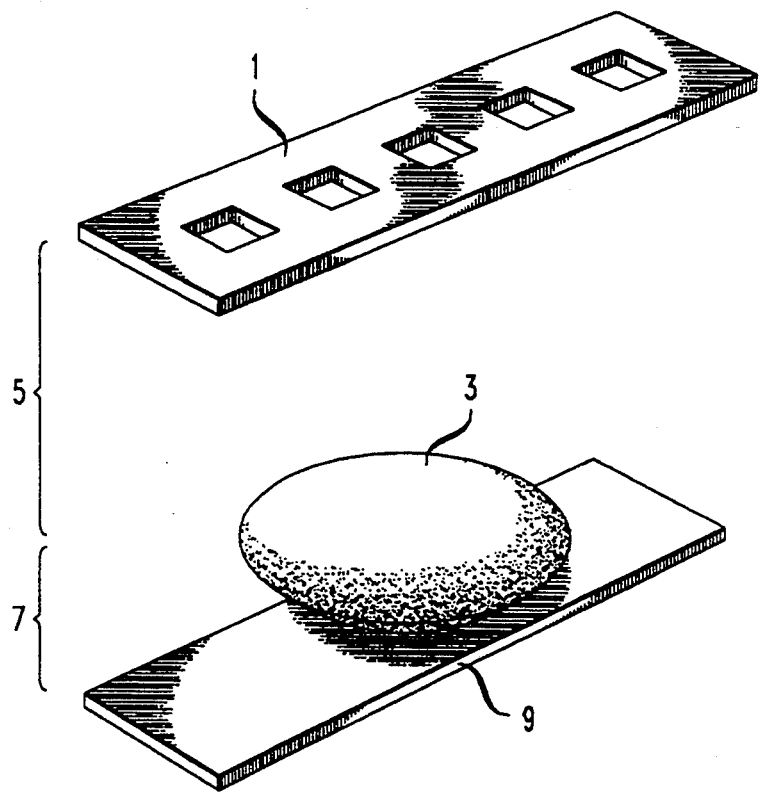
Figure 3:
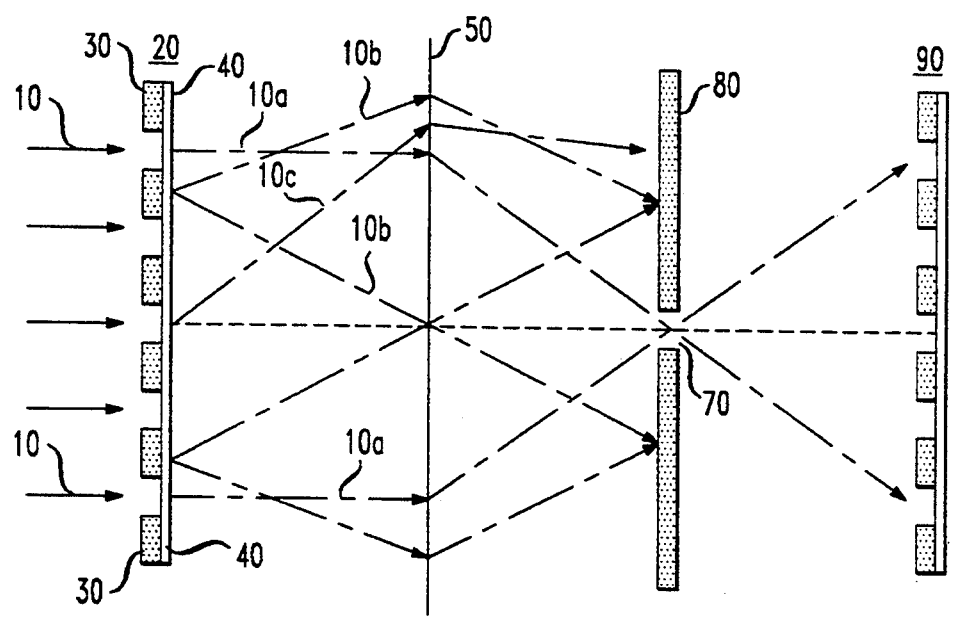
FIG. 3 illustrates systems involved in the invention.

Although the invention is particularly advantageous for SCALPEL systems, it is also applicable to all charged particle projection lithography processes. Therefore, the invention is applicable to ion projection systems. Indeed, for ion lithography, the necessity for employing a shorter column is even more significant. This effect is especially significant in view of previous studies such as A. Chalupka, et al, *Microelectronic Engineering* 17, "Progress in Ion Projection Lithography", 229–240, Elsevier Science Publishers (1992), that have insisted on a relatively long column for ion projection printing. However, for pedagogic purposes, the invention will be described in terms of a process employing a SCALPEL system.

As discussed, the resolution obtained for charged particle beam projection processes is significantly enhanced by employing a relatively short column. It has been found that for image projection systems, and most importantly for those using a beam current density greater than 10 mA/cm² at the substrate, the achievable resolution decreases with approximately the square of the column length and is affected to a much lesser extent by factors such as current, voltage, and numerical aperture of the lens system. Although the exact power relationship for these other factors has not been precisely determined, it appears that resolution is dependent on these factors either approximately to the first power or to a fractional power. Thus, the importance of the column length is critical.

Generally, for electron lithographic processes such as SCALPEL, the column length should be 0.75 meter or less. For column lengths greater than 0.75 meter, the achievable resolution is significantly limited. This result is especially significant since for SCALPEL it is contemplated that devices having a design rule of 0.5 micrometer or less are advantageously produced. Attainment of such design rules with a column greater than 0.75 meter is made substantially more difficult. For ion beam lithography, the factors involved are the same and again, desirable resolution, in view of the probable commercial significance is undesirably affected if a column length greater than 0.75 meter is used.

For SCALPEL technology, a column length of 0.75 meter or less is, in one embodiment, achieved by employing a projection system using VAL or VAIL. Such systems are extensively described in articles such as *Journal of Vacuum Science and Technology*, 15, 849–852, May/June (1978), and *Microcircuit Engineering* 83, "Variable Axis Immersion Lens (VAIL)", 107–116, Academic Press London (1983). A VAL or VAIL projection lens is advantageous because acceptable curvature of field errors and acceptable field size are obtainable despite the limitation of relatively short focal lengths. Thus, by employing a VAIL lens, even for demagnifications of 4 to 1, the column length is maintainable below 0.75 meter. (Use of a VAIL lens is discussed in U.S. patent applications Ser. Nos. 07/913509 and 07/913508, both dated Jul. 14, 1992, which are hereby incorporated by reference).

The precise column length employed to achieve a specific resolution depends on many factors influenced by a variety of parameters used in the lithographic systems. A control sample is conventionally employed to determine the precise column length required to yield a desired resolution given the particular exposure parameters chosen.

Figure 5:
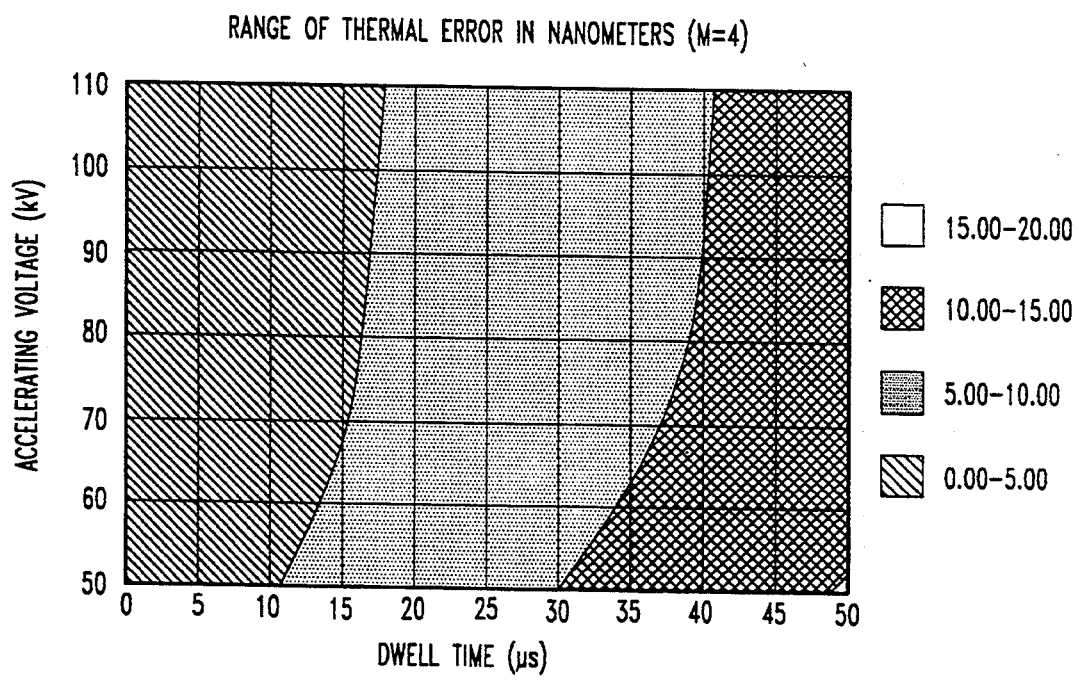
FIGS. 5 and 6 illustrate ranges of thermal error in SCALPEL lithography.
Figure 6:
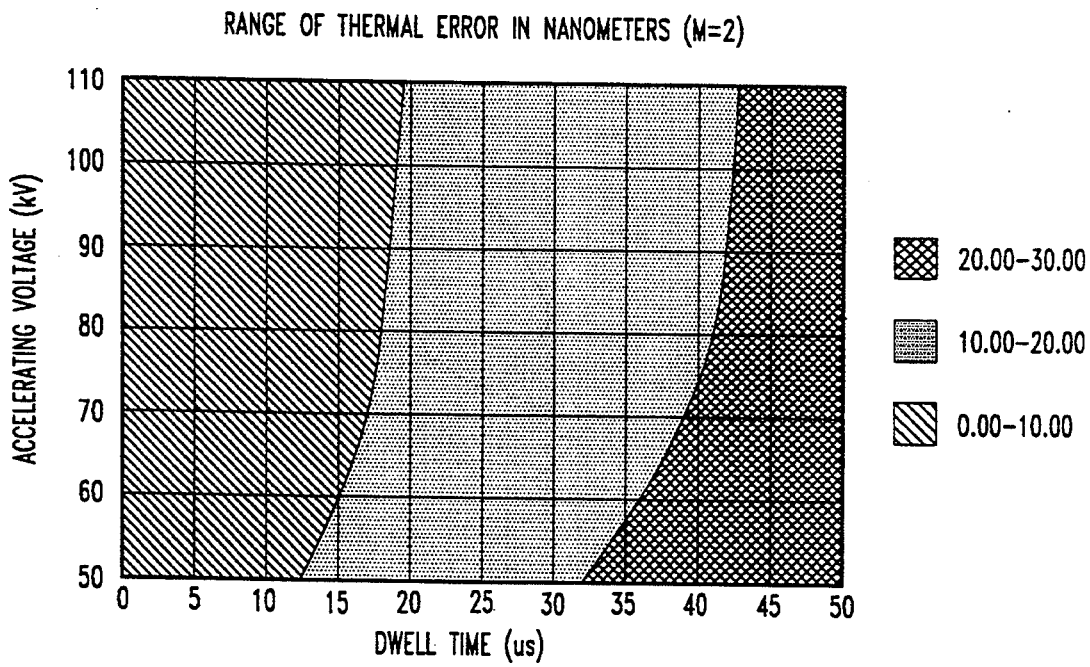

Thermal effects in a SCALPEL system if not appropriately controlled, strongly influence the obtainable pattern resolution. Surprisingly, the effect of thermal expansion and resulting pattern distortion decreases on the substrate with increasing acceleration voltage to offset in a meaningful acceleration regime the inverse effect in the mask. As a result, a minimum in the thermal error with acceleration voltage occurs and by an appropriate choice of 1) membrane thickness, 2) dwell time, and 3) magnification, a thermal error of less than 20% of the design rule is obtainable. The choice of dwell time, magnification, and mask membrane thickness is made as previously discussed by employing equations (1) to (9) to choose such parameters that yield a thermal error (with its associated acceleration voltage) in the desired range. For typical projected images, using a resist that has a sensitivity of approximately 5 $\mu C/cm^2$ at 20 KeV, a dwell time in the range 0.1 to 10 $\mu s$, a magnification in the range 2 to 5, and a membrane thickness in the range 500 to 1500 Å are generally used. Exemplary obtainable reductions in overlay errors in accordance with equations (1) to (9) for such conditions is shown in FIGS. 5 and 6.

The exact value employed within the desired range is generally determined by other considerations. For example, if the proximity effect is a substantial factor for the particular image being projected, it is desirable to operate at higher voltages that still yield thermal error within the acceptable range (and thus at corresponding values of dwell time, magnification, and membrane thickness) since correction for such proximity effect is somewhat easier at higher voltages. Additionally, as previously discussed, better resolution is generally obtained from the electron optics at higher acceleration voltages. However, as voltage gets higher and, for silicon, exceeds about 180 KeV defects due to displacement of silicon atoms in the wafer matrix begin to affect device performance.

The effect of scan ram is based on a preferred scan procedure. To avoid unacceptable error, the electron beam is scanned over a relatively small area using a multi-cycle scan to expose this area. Typically, for masks such as described in co-pending U.S. patent application Ser. No. 07/814953 (which is hereby incorporated by reference) the dwell time should be in the range 0.1 to 10 $\mu s$. Longer dwell times produce excessive error, while shorter dwell times produce substantial demands on the controlling electronics.

The number of cycles employed for a given area is determined by the dose required to expose the resist. For typical resist sensitivities in the range 0.05 $\mu C cm^{-2}/kV$ to 1 $\mu C cm^{-2}/kV$, beam currents in the range 50 $\mu A$ to 5 $\mu A$ and for typical dwell times in the range 0.1 $\mu s$ to 10 $\mu s$, 100 kHz to 10 MHz cycles are employed. (Currents less than 1 $\mu A$ are typically unacceptable since they lead to excessive exposure times while currents greater than 100 $\mu A$ are generally unacceptable since they lead to image blurring as a result of charged particle interactions. Generally, the current employed is determined by other factors such as desired throughput.) The size of an area scanned by the beam without relative movement of the mask and substrate is limited by the projection optics typically to areas in the range 1×1 to 10×10 mm at the wafer. Generally, for scan areas smaller than 1 mm on a side at the wafer, it is extremely difficult to prevent unacceptable thermal heating irrespective of scan rate. Although scan areas greater than 1×1 $cm^2$ are not precluded they are generally difficult to achieve with presently available electron optics.

Figure 4:
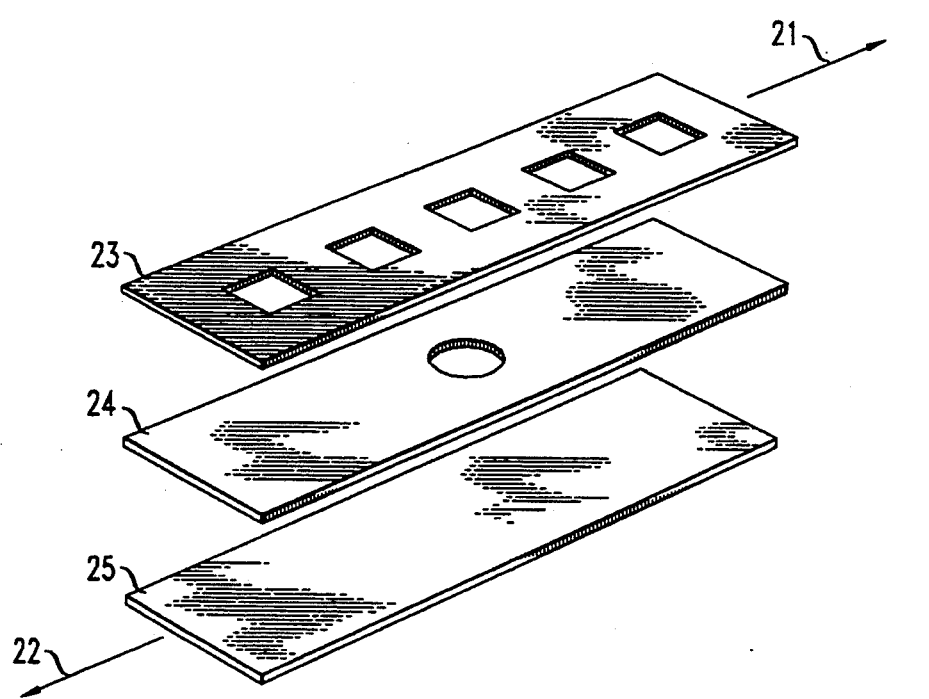
FIG. 4 illustrates a portion of an exposure technique employed in a SCALPEL system.

To image the entire pattern of the mask on the substrate as shown in FIG. 4 movement 23 of the mask relative to the substrate 25 is required. Clearly, since only 1% to 10% area of the mask is scanned in the cycle, (for typical mask sizes) the mask must be moved either continuously or stepwise to illuminate all desired regions. To ensure that a given portion of the mask is appropriately projected on the appropriate portion of the substrate, the direction of movement 21 of the mask 23 relative to the substrate 25 depends on the optics but in systems such as shown in FIG. 4 it is in the opposite direction 21, 20.

The dwell time, as discussed above, is interrelated to the demagnification factor. In operation, while the beam is cycling in a scan over a region of the mask, the mask is moving to present new regions to the scanning beam. For example, for 4:1 magnification, the mask should move at least 4 times as fast as the substrate to ensure appropriate positioning of the projected image. The relative rate generally would not be precisely 4 to 1 since the mask as presently contemplated-see U.S. patent application Ser. No. 07/814953 which is hereby incorporated by reference-has struts (acting as supports and heat sinks) which are not imaged and must be traversed. By this combined method of appropriately cycling over a region while the mask and substrate are moving relative to each other, thermal error is substantially reduced in a SCALPEL exposure technique by choosing appropriate operating values for magnification, dwell time, and mask membrane thickness in accordance with equations 1 to 9.

The membrane thickness should additionally be such that nonuniformities of the membrane and the resulting non-uniform expansion with change in temperature should not unacceptably affect resolution. Generally, for acceleration voltages in the range 50 to 200 kV, membrane thicknesses in the range 500 Å to 2000 Å are employed. Since a repetitive cycle scan is generally used, it is possible to measure dosage in a given area for each cycle by measuring current at wafer or the backscattering electron signal or aperture current. Subsequent cycles are adjusted to ensure the desired total dose is achieved.

I claim:

1. A process for fabricating a device having a design rule of 0.5 $\mu m$ or less comprising at least one lithographic delineation step, said step comprising illuminating a mask by scanning a beam of particles so as to produce a projected image on a device substrate by use of a lens system including a projection lens characterized in that the distance between said mask and said substrate is 0.75 meter or less and said beam has a current density of 10 $mA/cm^2$ or more at the substrate.

2. The process of claim 1 wherein said lens comprises a variable axis or variable axis immersion lens.

3. The process of claim 1 wherein said mask comprises areas that transmit said particles and areas that scatter particles.

4. The process of claim 1 wherein said particle comprises an electron.

5. The process of claim 1 wherein said particle comprises an ion.

* * * * *